United States Patent
Kirby

(10) Patent No.: US 11,735,528 B2
(45) Date of Patent: Aug. 22, 2023

(54) SEMICONDUCTOR MEMORY STACKS CONNECTED TO PROCESSING UNITS AND ASSOCIATED SYSTEMS AND METHODS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 17/588,694

(22) Filed: Jan. 31, 2022

(65) Prior Publication Data
US 2022/0157728 A1 May 19, 2022

Related U.S. Application Data

(63) Continuation of application No. 16/938,844, filed on Jul. 24, 2020, now Pat. No. 11,239,169.

(51) Int. Cl.
*H01L 23/538* (2006.01)
*G11C 5/02* (2006.01)
(Continued)

(52) U.S. Cl.
CPC .......... *H01L 23/5384* (2013.01); *G11C 5/025* (2013.01); *G11C 5/06* (2013.01); *H01L 21/50* (2013.01); *H01L 21/76877* (2013.01); *H01L 23/5385* (2013.01); *H01L 24/14* (2013.01); *H01L 25/0657* (2013.01)

(58) Field of Classification Search
CPC ................ H01L 23/5384; H01L 21/50; H01L 21/76877; H01L 23/5385; H01L 24/14; H01L 25/0657; H01L 24/81; H01L 24/73; H01L 24/02; H01L 24/13; H01L 24/16; H01L 24/17; H01L 24/08; H01L 2224/0239; H01L 2224/13025;
(Continued)

(56) References Cited

U.S. PATENT DOCUMENTS

2010/0226657 A1   9/2010   Raymond et al.
2015/0179285 A1   6/2015   Kilmer et al.
(Continued)

FOREIGN PATENT DOCUMENTS

CN   111244081 A   6/2020
TW   201515176 A   4/2015
(Continued)

OTHER PUBLICATIONS

International Application No. PCT/US2021/041202—International Search Report and Written Opinion, dated Nov. 9, 2021, 15 pages.
(Continued)

*Primary Examiner* — Elias Ullah
(74) *Attorney, Agent, or Firm* — Perkins Coie LLP

(57) ABSTRACT

A semiconductor memory stack connected to a processing unit, and associated methods and systems are disclosed. In some embodiments, the semiconductor memory stack may include one or more memory dies attached to and carried by a memory controller die—e.g., high-bandwidth memory. Further, a processing unit (e.g., a processor) may be attached to the memory controller die without an interposer to provide the shortest possible route for signals traveling between the semiconductor memory stack and the processing unit. In addition, the semiconductor memory stack and the processing unit can be attached to a package substrate without an interposer.

20 Claims, 5 Drawing Sheets

(51) Int. Cl.
  *G11C 5/06*      (2006.01)
  *H01L 21/50*     (2006.01)
  *H01L 21/768*    (2006.01)
  *H01L 23/00*     (2006.01)
  *H01L 25/065*    (2023.01)

(58) Field of Classification Search
  CPC . H01L 2224/16145; H01L 2224/16227; H01L 2224/1703; H01L 2224/17051; H01L 2224/73201; H01L 2224/80905; H01L 2224/81191; H01L 2225/06527; H01L 2225/06541; H01L 2924/15311; H01L 25/0652; H01L 25/50; H01L 24/80; H01L 2224/08145; H01L 2224/80895; H01L 2224/80896; H01L 2225/06517; H01L 2225/06562; H01L 25/18; G11C 5/025; G11C 5/06
  See application file for complete search history.

(56) References Cited

U.S. PATENT DOCUMENTS

| | | |
|---|---|---|
| 2016/0071818 A1 | 3/2016 | Wang et al. |
| 2020/0006268 A1 | 1/2020 | Takiar et al. |
| 2020/0168550 A1 | 5/2020 | Ryu et al. |
| 2020/0357746 A1 | 11/2020 | Koshikawa et al. |

FOREIGN PATENT DOCUMENTS

| | | |
|---|---|---|
| TW | 201921359 A | 6/2019 |
| TW | 202022863 A | 6/2020 |
| WO | 2019102528 A1 | 5/2019 |

OTHER PUBLICATIONS

TW Patent Application No. 110124911—Taiwanese Office Action and Search Report, dated May 10, 2022, with English Translation, 6 pages.

SEMICONDUCTOR MEMORY STACKS CONNECTED TO PROCESSING UNITS AND ASSOCIATED SYSTEMS AND METHODS

CROSS-REFERENCE TO RELATED APPLICATION(S)

This application is a continuation of U.S. application Ser. No. 16/938,844, filed Jul. 24, 2020; which is incorporated herein by reference in its entirety.

TECHNICAL FIELD

The present disclosure generally relates to semiconductor device assemblies, and more particularly relates to semiconductor memory stacks connected to processing units and associated systems and methods.

BACKGROUND

Semiconductor packages typically include one or more semiconductor dies (e.g., memory chips, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1A:
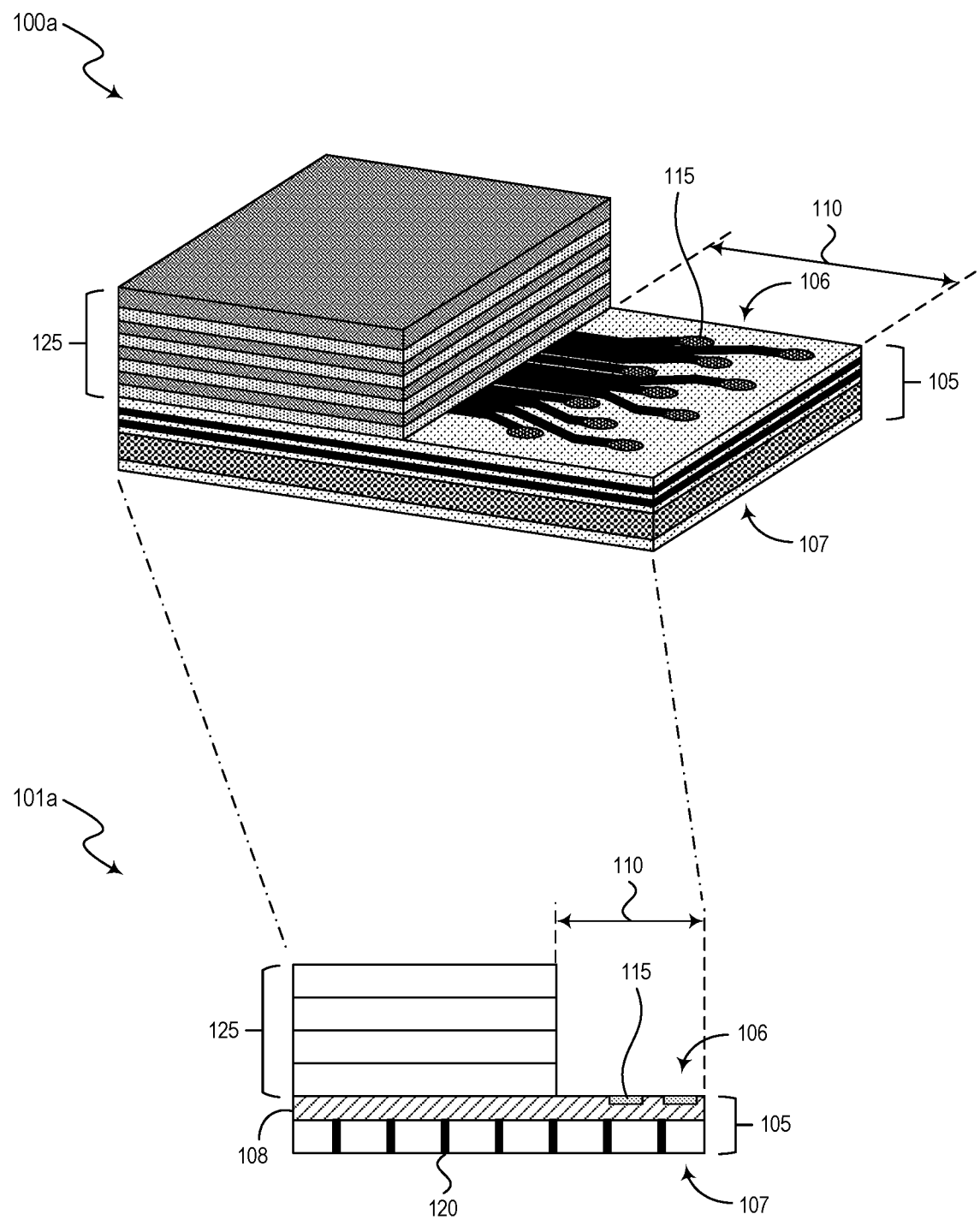
FIG. 1A illustrates example schematic diagrams of a semiconductor memory stack in accordance with embodiments of the present technology.

Specific details of several embodiments of one or more semiconductor memory stacks connected to a processing unit, and associated systems and methods are described below. The term "semiconductor device or die" generally refers to a solid-state device that includes one or more semiconductor materials. Examples of semiconductor devices include logic devices or dies, memory devices or dies, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package support substrate, a semiconductor device or die, or the like. A person having ordinary skill in the relevant art will recognize that suitable steps of the methods described herein can be performed with processing steps associated with fabricating semiconductor devices (wafer-level and/or die-level) and/or manufacturing semiconductor packages.

Certain computing systems, e.g., high-performance computing (HPC) systems, includes a processor coupled with a high-bandwidth memory (HBM) that includes one or more memory dies (e.g., DRAM dies) stacked over a controller. In some embodiments, the processor and the HBM may be attached side by side to an interposer including conductive traces that provides communication paths for signals between the processor and the HBM. In some cases, the interposer may become a bottle neck for designing a computing system to operate in HPC environments because maintaining fidelity of the signals transmitted and/or received through the interposer becomes more and more challenging—e.g., due to a distance for the signals to travel between the HBM and the processor. Further, the interposer adds to a total cost of the computing system in view of the interposer fabricated utilizing various semiconductor process technology applied to a silicon substrate—e.g., Si interposer.

The present technology eliminates the need for an interposer (e.g., Si interposer) and provides the shortest possible route for connecting a semiconductor memory stack and a processing unit. The semiconductor memory stack may include one or more memory dies (or a stack of memory dies) attached to and carried by a controller die—e.g., an HBM. As described in more detail herein, the controller die of the semiconductor memory stack may be attached to a package substrate with its front surface or front side facing away from the package substrate—i.e., a back side of the controller die facing the package substrate—without an interposer. In addition, the processing unit may be arranged over the controller die (and the package substrate) with its front surface or front side facing toward the controller die (and the package substrate). Further, a first region of the processing unit may be directly attached to an uncovered portion of the controller die (i.e., unobstructed by the memory dies) such that the controller die and the processing unit can establish electrical connections therebetween—e.g., direct chip-to-chip connections without an interposer.

In addition, the processing unit may establish electrical connections with the package substrate without using an interposer. Namely, a second region of the processing unit that is not directly attached to the controller die, may be coupled with conductive components (e.g., bond pads) of the package substrate through conductive pillars and/or solder balls. In this manner, the present technology provides the shortest possible route between the semiconductor memory stack (i.e., the controller die carrying the memory dies) and the processing unit absent the conductive traces of the interposer, while directly connecting both the semiconductor memory stack (i.e., the controller die carrying the memory dies) and the processing unit to the package substrate without the interposer.

As used herein, the terms "front," "back," "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1A illustrates example schematic diagrams of a semiconductor memory stack in accordance with embodiments of the present technology. The semiconductor memory stack may be an example of an HBM or include aspects of an HBM. FIG. 1A includes a three-dimensional (3D) diagram 100a of the semiconductor memory stack and a schematic cross-sectional diagram 101a that generally corresponds to the 3D diagram 100a.

The diagram 101a describes the semiconductor memory stack including a controller die 105 (which may be variously referred to as a controller, an interface (IF) die, a logic die, an HBM controller die, a memory controller die) and a stack of memory dies 125 attached to the controller die 105. The controller die 105 includes a front side 106 and a back side 107 opposite to the front side 106. The stack of memory dies 125 is attached to the front side 106 of the controller die 105. The controller die 105 includes active components (e.g., various control circuitry, such as interface circuits, channel control circuits, etc.) proximate to the front side 106. The controller die 105 may also include a layer 108 with conductive traces, such as multiple levels of metal layers and vias (which may also be referred to as interconnects) embedded in a dielectric layer, such that the active components of the controller die 105 may be coupled with the stack of memory dies 125 and conductive components 115 of the controller die 105. In some embodiments, the conductive components 115 may include connection pads including copper (Cu), thin-film metal layer stack configured for conductive pillars and/or under-bump metallization, or the like.

As depicted in FIG. 1A, an edge of the controller die 105 extends past a corresponding edge of the stack of memory dies 125 such that a portion 110 of the front side 106 of the controller die 105 is uncovered by the stack of memory dies 125. As such, the portion 110 may be referred to as an exposed portion 110 and/or an uncovered portion 110. In this regard, the controller die 105 may be regarded to have an increased die size to include the exposed portion 110 where the conductive components 115 are disposed. The exposed portion 110 (at least some part of the exposed portion 110 including conductive components 115) may be placed under a processor die (e.g., a processing unit, a microprocessor (e.g., GPU, CPU)) such that direct electrical connections between the conductive components 115 and corresponding conductive components of the processor die (e.g., direct chip-to-chip connections), absent an interposer therebetween. Further, the controller die 105 may include through-substrate vias (TSVs) 120. The TSVs 120 are configured to relay electrical signals between the front side 106 and the back side 107 of the controller die 105. For example, the TSVs 120 may be coupled to the active components of the controller die 105.

In some embodiments, the semiconductor memory stack of the diagram 101a can be formed by attaching a stack of memory dies to a front side of a memory controller die such that a portion of the front side is exposed (i.e., uncovered by the stack of memory dies). The exposed portion of the memory controller may include a plurality of first conductive components (e.g., conductive components 115). In this regard, the present technology includes increasing a size of the memory controller die such that the memory controller die can have an unobstructed portion (e.g., exposed portion, uncovered portion) to place the conductive components therein. The conductive components (e.g., conductive components 115) placed in the exposed portion may be identified for exchanging signals with a processor die as described with reference to FIG. 1C. In this manner, the exposed portion of the memory controller die can be positioned under a region of the processor die that faces the memory controller die such that the front sides of the memory controller die and the processor die can be directly attached to each other.

Although in the foregoing example embodiments, a semiconductor memory stack including four (4) memory dies has been described and illustrated, in other embodiments, semiconductor memory stacks may be provided to have different quantities of memory dies. For example, semiconductor memory stacks may include a less (e.g., one, two, three) or greater (e.g., six, eight, twelve, or even greater) quantity of memory dies than the semiconductor memory stack depicted in FIG. 1A.

Figure 1B:
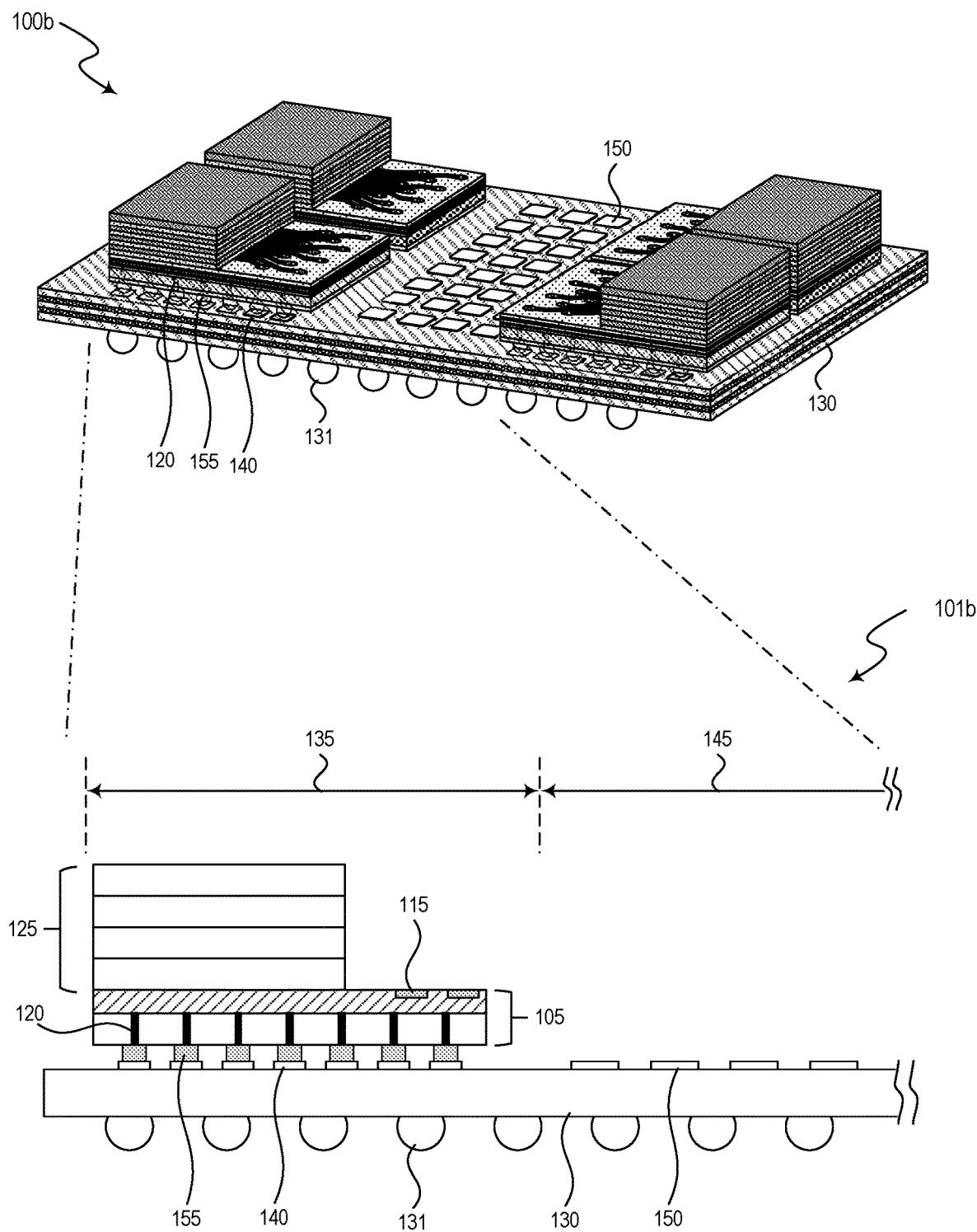
FIG. 1B illustrates example schematic diagrams including one or more semiconductor memory stacks and a substrate in accordance with embodiments of the present technology.

FIG. 1B illustrates example schematic diagrams including one or more semiconductor memory stacks and a substrate in accordance with embodiments of the present technology. FIG. 1B includes a 3D diagram 100b of four (4) semiconductor memory stacks mounted on a substrate 130 and a schematic cross-sectional diagram 101b that generally corresponds to the 3D diagram 100b.

The diagram 101a describes one of the semiconductor memory stacks attached to the substrate 130. The substrate 130 may include a first section 135 for attaching the semiconductor memory stacks and a second section 145 for directly attaching a processor die. Further, the substrate 130 may include a set of conductive components 140 in the first section 135 and another set of conductive components 150 in the second section 145. The substrate 130 also includes substrate terminals 131 for external communications between the controller die 105 (and/or the processor die 160 as depicted in FIG. 3C) and higher-level circuitry. In some embodiments, the set of conductive components 140 may be compatible with forming and/or attaching to an array of solder balls (e.g., ball grid array (BGA)). Further, the set of conductive components 150 may be compatible with forming and/or attaching to conducive pillars or solder balls.

As depicted in FIG. 1B, the back side 107 of the controller die 105 may be attached to the substrate 130 through an array of solder balls 155. In this regard, each of the TSVs 120 of the controller die 105 may be connected to corresponding conductive components 140 in the first section 135 of the substrate 130, through a solder ball 155 of the array. Accordingly, the controller die 105 and the substrate 130 can transmit and/or receive signals through at least one of the TSVs 120 connected to the corresponding one of the conductive components 140, exclusive of an interposer layer including conductive traces.

The semiconductor memory stack attached to the substrate as depicted in the diagram 101b can be formed by attaching the back side of the memory controller die carrying the stack of memory dies to the substrate as described herein. For example, an array of solder balls (e.g., solder balls 155) may be formed on the back side of the memory controller die, where each of the solder balls is coupled to corresponding TSVs (e.g., TSVs 120) of the memory controller die. Alternatively, the array of solder balls may be formed on the substrate, where each of the solder balls is coupled to corresponding conductive component of the substrate (e.g., conductive components 140). Subsequently, the memory controller die may be arranged over the substrate such that each of the TSVs can be aligned with the corresponding one of the conductive components (e.g., conductive components 140). Further, the memory controller die can be brought to the substrate (or the substrate may be brought to the memory controller) such that each of the TSVs is connected to the corresponding one of the conductive components through the solder ball of the array.

Figure 1C:
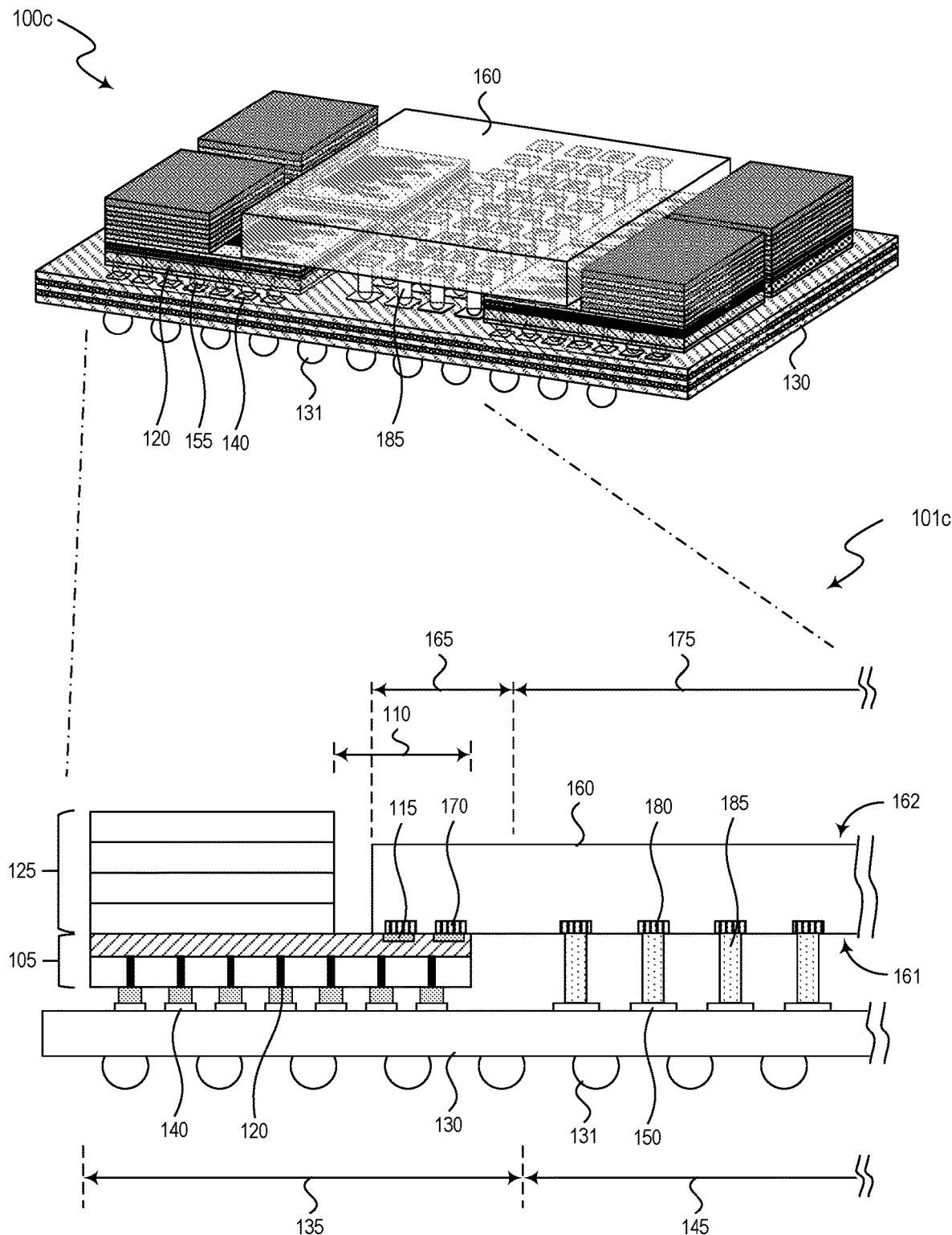
FIG. 1C illustrates example schematic diagrams of a semiconductor die assembly including one or more semiconductor memory stacks, a processing unit, and a substrate in accordance with embodiments of the present technology.

FIG. 1C illustrates example schematic diagrams of a semiconductor die assembly including one or more semiconductor memory stacks, a processing unit, and a substrate in accordance with embodiments of the present technology. FIG. 1C includes a 3D diagram 100c of the semiconductor die assembly including four (4) semiconductor memory stacks and a processor die 160 mounted on the substrate 130 and a schematic cross-sectional diagram 101c that generally corresponds to the 3D diagram 100c.

The diagram 101c describes one of the semiconductor memory stacks attached on the first section 135 of the substrate 130 and the processor die 160 attached to the controller die 105 and to the second section 145 of the substrate 130. The processor die 160 includes a first side 161 and a second side 162 opposite to the first side 161. Similar to the controller die 105, the processor die 160 includes various active components (e.g., graphics and compute array and peripheral circuitry of a GPU, a cache memory and an arithmetic logic circuit of a CPU) proximate to the first side 161.

Further, the processor die 160 may include a first group of conductive components 170 disposed in a first region 165 of the first side 161 and a second group of conductive components 180 disposed in a second region 175 of the first side 161. The first and second groups of conductive components 170 and 180 are coupled with the active components of the processor die 160. In some embodiments, each of the conductive components 170 and/or 180 may be surrounded by a dielectric material, such as oxide, nitride, oxynitride, etc. In some embodiments, the conductive components 170 may include connection pads including copper (Cu), thin-film metal layer stack configured for conductive pillars and/or under-bump metallization, or the like. Further, the conductive components 180 may be compatible with forming and/or attaching to conducive pillars or solder balls.

As depicted in FIG. 1C, the front side 161 of the processor die 160 faces the front side 106 of the controller die 105 and the substrate 130—e.g., the processor die 160 is flipped to have its front side 161 facing down toward the controller die 105 and the substrate 130. Further, the processor die 160 may be arranged over the controller die 105 such that the first region 165 of the processor die 160 faces and overlaps the exposed portion 110 of the controller die 105. In addition, the second region 175 of the processor die 160 faces the second section 145 of the substrate 130. In this manner, each of the conductive components 115 in the exposed portion 110 can be aligned and coupled with corresponding one of the conductive components 170 in the first region 165. Similarly, each of the conductive components 150 in the second section 145 of the substrate 130 can be aligned and coupled with corresponding one of the conductive components 180 in the second region 175 of the processor die 160.

In some embodiments, each of the conductive components 115 is aligned and directly bonded to the corresponding one of the conductive components 170 in the first region 165, and a dielectric material surrounding each of the conductive components 115 (e.g., the dielectric material of the layer 108 of the controller die 105) is directly bonded to another dielectric material surrounding each of the conductive components 170. In this regard, as two or more dissimilar materials (e.g., the dielectric materials and the conductive materials) are directly bonded together, respectively, to form interconnects and surrounding dielectric layers, such a configuration may be referred to combination bonding, hybrid bonding, direct bonding, or the like. In some embodiments, both the conductive components 115 and 170 include copper as a common primary constituent, and each of the conductive components 115 is in direct contact with the corresponding one of the conductive components 170. In some embodiments, either each of the conductive components 115 or each of the conductive components 170 includes a conductive pillar (not shown) such that each of the conductive components 115 can be connected to the corresponding one of the conductive components 170 through the conductive pillar.

In this manner, the processor die 160 and the controller die 105 may transmit and/or receive signals through at least one of the conductive components 115 coupled with the corresponding one of the conductive components 170, exclusive of an interposer layer including conductive traces. Accordingly, the present technology can provide the shortest possible route for connecting the semiconductor memory stack (i.e., the stack of memory dies 125 carried by the controller die 105) and the processing unit (e.g., the processor die, GPU, CPU).

Further, the conductive components 180 of the processor die 160 can be coupled to corresponding conductive components 150 of the substrate 130. In some embodiments, each of the conductive components 180 includes a conductive pillar 185 such that the conductive components 180 can be connected to the corresponding one of the conductive components 150 through the conductive pillar 185. Alternatively, each of the conductive components 150 may include the conductive pillar 185 such that the conductive components 180 can be connected to the corresponding one of the conductive components 150 through the conductive pillar 185. In some embodiments, an array of solder balls (not shown) may be disposed between the processor die 160 and the substrate 130 such that each of the conductive components 180 can be connected to the corresponding one of the conductive components 150 through a solder ball of the array. In some embodiments, the conductive pillars and/or solder balls disposed between the processor die 160 and the substrate 130 may include certain heights and/or distributions to prevent the processor die 160 from being tilted and/or sagged—e.g., to provide mechanical support for the processor die 160.

In this manner, the processor die 160 and the substrate 130 can transmit and/or receive signals through at least one of the conductive components 180 coupled with the corresponding one of the conductive components 150, exclusive of an interposer layer including conductive traces. Further, as described with reference to FIG. 1B, the controller die 105 and the substrate 130 also can transmit and/or receive signals through at least one of the TSVs 120 connected to the corresponding one of the conductive components 140, exclusive of the interposer layer.

In some embodiments, two end regions of the processor die 160 may be directly attached to controller dies as depicted in the diagram 100c. In such embodiments, a central region of the processor die may include a set of active components (e.g., various circuitry) for communicating (or otherwise interfacing) with higher-level circuitry (e.g., a host device) through the connections (e.g., the conductive pillars 185 and/or the solder balls) established between the processor die 160 and the substrate 130. As such, the end regions of the processor die may include another set of active components for communicating (or otherwise interfacing) with the semiconductor memory stack (e.g., peripheral circuitry of a GPU).

Although in the foregoing example embodiments, the processor die has been described and illustrated to couple with four (4) semiconductor memory stacks, in other embodiments, processor dies may be provided to couple with different quantities of semiconductor memory stacks. For example, processor dies may couple with a less (e.g., one, two, three) or greater quantity of semiconductor memory stacks (e.g., six, eight, or even greater) than the processor die depicted in FIG. 1C.

The processor die attached to the semiconductor memory stack and to the substrate as depicted in the diagram 101c can be formed by attaching the front side 161 of the processor die 160 to the exposed portion of the memory controller die 105 and to the second section 145 of the substrate 130. For example, a processor die (e.g., the processor die 160) may be flipped to have its front side 161 facing the memory controller die and the substrate 130. Further, the processor die may be arranged over the memory controller die such that the first region 165 of the processor die can face the exposed portion 110 (the uncovered or unobstructed portion) of the memory controller die. As such, each of the conductive components 115 of the memory controller die may be aligned with a corresponding one of the conductive components 170 of the processor die. In addition, the second region 175 of the processor die may face the second section 145 of the substrate such that each of the conductive components 180 can be aligned with a corresponding one of the conductive components 150 of the substrate.

Attaching the Processor Die to the Memory Controller Die:

In some embodiments, the processor die 160 may be bonded to the memory controller die 105 to directly bond each of the conductive components 115 of the memory controller die to the corresponding one of the conductive components 170 of the processor die. In addition, a first dielectric material surrounding each of the conductive components 115 of the memory controller die 105 (e.g., the dielectric material of the layer 108 of the controller die 105) may be bonded to a second dielectric material surrounding each of the conductive components 170 of the processor die.

In some embodiments, the processor die 160 may be brought to the memory controller die 105 such that each of the conductive components 115 of the memory controller die is in direct contact with the corresponding one of the conductive components 170 of the processor die. Further, the conductive components 115 and the conductive components 170 include copper as a common primary constituent.

In some embodiments, a conductive pillar (not shown) may be formed on either each of the conductive components 115 of the memory controller die or each of the conductive components 170 of the processor die. Subsequently, the processor die may be brought to the memory controller die such that each of the conductive components 115 of the memory controller die is connected to the corresponding one of the conductive components 170 of the processor die through the conductive pillar.

Attaching the Processor Die to the Substrate:

In some embodiments, a conductive pillar (e.g., the conductive pillar 185) may be formed on each of the conductive components 180 of the processor die 160 (or alternatively, on each of the conductive components 150 of the substrate). Subsequently, the processor die may be arranged over the substrate such that each of the conductive components 180 is aligned with the corresponding one of the conductive components 150 of the substrate. Further, the processor die may be brought to the substrate such that each of the conductive components 180 is connected to the corresponding one of the conductive components 150 of the substrate through the conductive pillar 185.

In some embodiments, a solder ball (not shown) may be formed on each of the conductive components 180 of the processor die 160 (or alternatively, on each of the conductive components 150 of the substrate). Subsequently, the processor die may be arranged over the substrate such that each of the conductive components 180 is aligned with the corresponding one of the conductive components 150 of the substrate. Further, the processor die may be brought to the substrate (or vice versa) such that each of the conductive components 180 is connected to the corresponding one of the conductive components 150 of the substrate through the solder ball.

Figure 2:
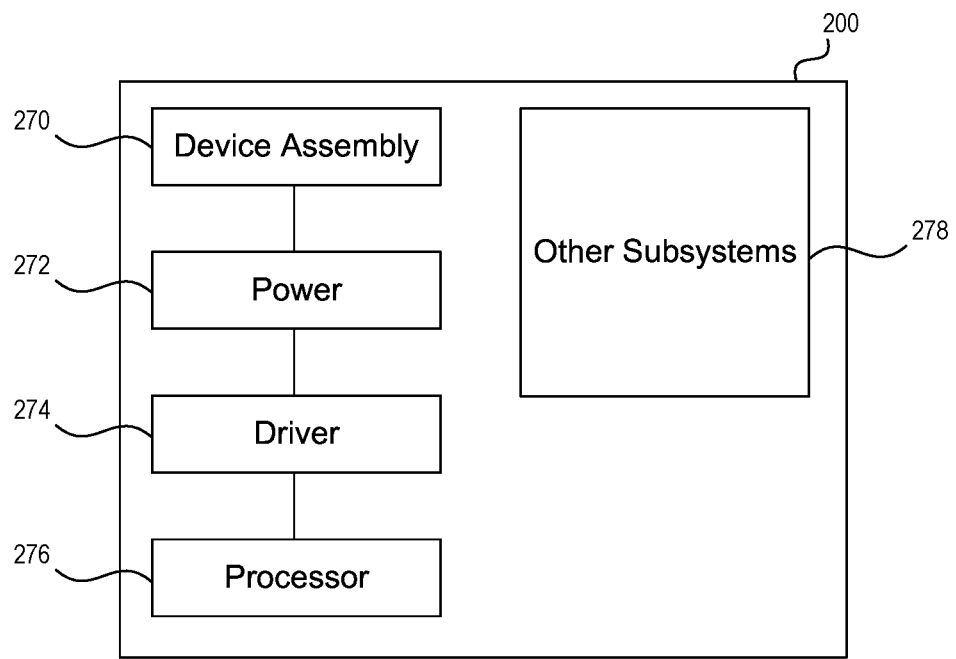
FIG. 2 is a block diagram schematically illustrating a system including a semiconductor die assembly configured in accordance with an embodiment of the present technology.

FIG. 2 is a block diagram schematically illustrating a system 200 including a semiconductor die assembly configured in accordance with an embodiment of the present technology. The system 200 can include a semiconductor device assembly 270, a power source 272, a driver 274, a processor 276, and/or other subsystems or components 278. The semiconductor device assembly 270 can be incorporated into any of a myriad of larger and/or more complex systems, a representative example of which is the system 200 shown schematically in FIG. 2. The semiconductor die assembly described with reference to FIG. 1C may be included in a semiconductor device assembly 270 of the system 200.

The semiconductor device assembly 270 can have features generally similar to the semiconductor die assembly. For example, the semiconductor device assembly 270 may include one or more semiconductor memory stacks that each has a controller die carrying one or more memory dies (e.g., a stack of memory dies). Further, the semiconductor device assembly 270 may include a processor die attached to the controller die to provide the shortest possible route for connecting the semiconductor memory stack and the processor die. In addition, the semiconductor device assembly 270 may include a substrate that carries both the semiconductor memory stack and the processor die without an interposer. The resulting system 270 can perform any of a wide variety of functions, such as memory storage, data processing, and/or other suitable functions. Accordingly, representative systems 270 can include, without limitation, hand-held devices (e.g., mobile phones, tablets, digital readers, and digital audio players), computers, and appliances. Components of the system 270 may be housed in a single unit or distributed over multiple, interconnected units (e.g., through a communications network). The components of the system 270 can also include remote devices and any of a wide variety of computer readable media.

Figure 3:
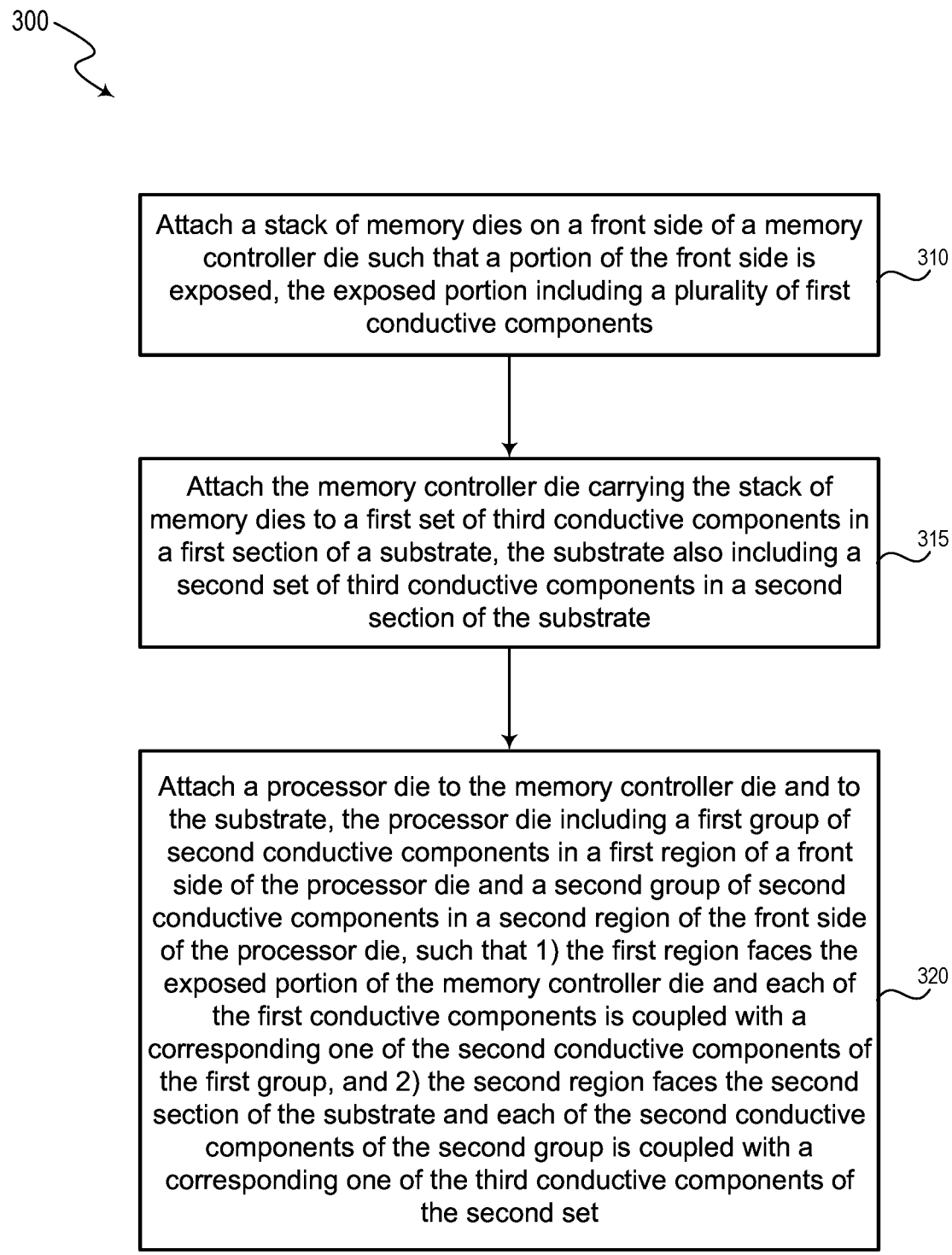
FIG. 3 is a flowchart of a method of making a semiconductor die assembly in accordance with embodiments of the present technology.

FIG. 3 is a flowchart 300 of a method of making a semiconductor die assembly in accordance with embodiments of the present technology. The flowchart 300 may include aspects of methods as described with reference to FIGS. 1A through 1C.

The method includes attaching a stack of memory dies on a front side of a memory controller die such that a portion of the front side is exposed, the exposed portion including a plurality of first conductive components (box 310). The method further includes attaching the memory controller die carrying the stack of memory dies to a first set of third conductive components in a first section of a substrate, the substrate also including a second set of third conductive components in a second section of the substrate (box 315). The method further includes attaching a processor die to the memory controller die and to the substrate, the processor die including a first group of second conductive components in a first region of a front side of the processor die and a second group of second conductive components in a second region of the front side of the processor die, such that 1) the first region faces the exposed portion of the memory controller die and each of the first conductive components is coupled with a corresponding one of the second conductive components of the first group, and 2) the second region faces the second section of the substrate and each of the second conductive components of the second group is coupled with a corresponding one of the third conductive components of the second set (box 320).

In some embodiments, attaching the processor die to the memory controller die includes arranging the processor die over the memory controller die such that each of the first conductive components is aligned with the corresponding one of the second conductive components of the first group, and bonding the processor die to the memory controller die to directly bond each of the first conductive components to the corresponding one of the second conductive components of the first group, where a first dielectric material surrounding each of the first conductive components is concurrently bonded to a second dielectric material surrounding each of the second conductive components of the first group.

In some embodiments, attaching the processor die to the memory controller die includes arranging the processor die over the memory controller die such that each of the first conductive components is aligned with the corresponding one of the second conductive components of the first group, and bring the processor die to the memory controller die such that each of the first conductive components is in direct contact with the corresponding one of the second conductive components of the first group, where the first conductive components and the second conductive components of the first group comprise copper as a common primary constituent.

In some embodiments, attaching the processor die to the memory controller die includes forming a conductive pillar on either each of the first conductive components or each of the second conductive components of the first group, and arranging the processor die over the memory controller die such that each of the first conductive components is aligned with the corresponding one of the second conductive components of the first group, and bringing the processor die to the memory controller die such that each of the first conductive components is connected to the corresponding one of the second conductive components of the first group through the conductive pillar.

In some embodiments, attaching the processor die to the substrate includes forming a solder ball on each of the second conductive components of the second group, arranging the processor die over the substrate such that each of the second conductive components of the second group is aligned with the corresponding one of the third conductive components of the second set, and bringing the processor die to the substrate such that each of the second conductive components of the second group is connected to the corresponding one of the third conductive components of the second set through the solder ball.

In some embodiments, attaching the processor die to the substrate includes forming a conductive pillar on each of the second conductive components of the second group, arranging the processor die over the substrate such that each of the second conductive components of the second group is aligned with the corresponding one of the third conductive components of the second set, and bringing the processor die to the substrate such that each of the second conductive components of the second group is connected to the corresponding one of the third conductive components of the second set through the conductive pillar.

In some embodiments, the memory controller die comprises a plurality of through-silicon-vias (TSVs) configured to relay electrical signals between the front side of the memory controller die and a back side of the memory controller die, and attaching the memory controller die to the substrate includes forming an array of solder balls that each are coupled with corresponding TSVs, arranging the memory controller die over the substrate such that each of the TSVs is aligned with the corresponding one of the third conductive components of the first set, and bringing the memory controller die to the substrate such that each of the TSVs is connected to the corresponding one of the third conductive components of the first set through a solder ball of the array.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a first memory controller carrying a first stack of memory dies on a front side thereof, wherein an edge of the first memory controller extends past a corresponding edge of the first stack of memory dies such that a portion of the front side of the first memory controller is exposed, the exposed portion including a first plurality of conductive components;
   a second memory controller carrying a second stack of memory dies on a front side thereof, wherein an edge of the second memory controller extends past a corresponding edge of the second stack of memory dies such that a portion of the front side of the second memory controller is exposed, the exposed portion including a second plurality of conductive components;
   a processor including first and second groups of conductive components on a front side thereof, wherein the processor is arranged over both the first and second memory controllers such that each of the conductive components of the first plurality is coupled with a corresponding one of the conductive components of the first group, and each of the conductive components of the second plurality is coupled with a corresponding one of the conductive components of the second group.

2. The semiconductor die assembly of claim 1, wherein:
   the first memory controller comprises a first plurality of through-silicon-vias (TSVs) configured to relay electrical signals between the front side and a back side of the first memory controller; and
   the second memory controller comprises a second plurality of TSVs configured to relay electrical signals between the front side and a back side of the second memory controller.

3. The semiconductor die assembly of claim 2, further comprising a substrate carrying the first memory controller and the second memory controller, and in electrical contact with the first and second pluralities of TSVs.

4. The semiconductor die assembly of claim 3, wherein the first memory controller comprises a first plurality of signal paths electrically coupling the first stack of memory dies to the processor through the first plurality of conductive components and a second plurality of signal paths electrically coupling the first stack of memory dies to the substrate through the first plurality of TSVs.

5. The semiconductor die assembly of claim 1, wherein:
   the processor and the first memory controller transmit and/or receive signals through at least one of the conductive components of the first plurality coupled with the corresponding one of the conductive components of the first group, exclusive of any interposer layer comprising conductive traces; and
   the processor and the second memory controller transmit and/or receive signals through at least one of the conductive components of the second plurality coupled with the corresponding one of the conductive components of the third group, exclusive of any interposer layer comprising conductive traces.

6. The semiconductor die assembly of claim 1, wherein each of the conductive components of the first plurality is aligned and directly bonded to the corresponding one of the conductive components of the first group, and a first dielectric material surrounding each of the conductive components of the first plurality is directly bonded to a second dielectric material surrounding each of the conductive components of the first group.

7. The semiconductor die assembly of claim 1, wherein both the conductive components of the first plurality and the conductive components of the first group comprise copper as a common primary constituent.

8. A semiconductor die assembly, comprising:
   a plurality of memory controllers, each carrying a stack of memory dies on a front side thereof, wherein an edge of each memory controller of the plurality extends past a corresponding edge of the carried stack of memory dies such that a portion of the front side of each memory controller is exposed, the exposed portion including a plurality of conductive components;
   a processor including a plurality of groups of conductive components on a front side thereof, wherein the processor is arranged over the plurality of memory controllers such that each conductive component of the plurality of conductive components of each of the plurality of memory controllers is coupled with a corresponding one of the conductive components of a corresponding group of the plurality of groups.

9. The semiconductor die assembly of claim 8, wherein:
   each of the plurality of memory controllers comprises a plurality of through-silicon-vias (TSVs) configured to relay electrical signals between the front side and a back side of the memory controller.

10. The semiconductor die assembly of claim 9, further comprising a substrate carrying the plurality of memory controllers and in electrical contact with the plurality of TSVs of each of the plurality of memory controllers.

11. The semiconductor die assembly of claim 8, wherein each memory controller comprises a first plurality of signal paths electrically coupling the carried stack of memory dies to the processor through the corresponding plurality of conductive components and a second plurality of signal paths electrically coupling the carried stack of memory dies to the substrate through the plurality of TSVs.

12. The semiconductor die assembly of claim 8, wherein:
    the processor and each of the plurality of memory controllers transmit and/or receive signals through at least one of the conductive components of the plurality of conductive components coupled with the corresponding one of the conductive components of the group of conductive components, exclusive of any interposer layer comprising conductive traces.

13. A semiconductor die assembly, comprising:
a memory controller die carrying a stack of memory dies on a front side thereof, wherein an edge of the memory controller die extends past a corresponding edge of the stack of memory dies such that a portion of the front side of the memory controller die is uncovered by the stack of memory dies, the portion including a plurality of first conductive components;
a processor die including a first group of second conductive components in a first region of a front side of the processor die and a second group of second conductive components in a second region of the front side of the processor die, wherein the processor die is arranged over the memory controller die such that the first region of the processor die faces the portion of the memory controller die, and each of the first conductive components is coupled with a corresponding one of the second conductive components of the first group.

14. The semiconductor die assembly of claim 13, wherein each of the first conductive components is aligned and directly bonded to the corresponding one of the second conductive components of the first group, and a first dielectric material surrounding each of the first conductive components is directly bonded to a second dielectric material surrounding each of the second conductive components of the first group.

15. The semiconductor die assembly of claim 13, wherein both the first conductive components and the second conductive components of the first group comprise copper as a common primary constituent, and each of the first conductive components is in direct contact with the corresponding one of the second conductive components of the first group.

16. The semiconductor die assembly of claim 13, wherein either each of the first conductive components or each of the second conductive components of the first group comprises a conductive pillar, and each of the first conductive components is connected to the corresponding one of the second conductive components of the first group through the conductive pillar.

17. The semiconductor die assembly of claim 13, wherein the processor die and the memory controller die transmit and/or receive signals through at least one of the first conductive components coupled with the corresponding one of the second conductive components, exclusive of an interposer layer comprising conductive traces.

18. The semiconductor die assembly of claim 13, wherein each of the second conductive components of the second group comprises a conductive pad configured for under-bump metallization.

19. The semiconductor die assembly of claim 13, wherein:
the memory controller die comprises a plurality of through-silicon-vias (TSVs) configured to relay electrical signals between the front side of the memory controller die and a back side of the memory controller die;
the back side of the memory controller die is attached to a substrate through an array of solder balls.

20. The semiconductor die assembly of claim 19, wherein the memory controller die and the substrate transmit and/or receive signals through at least one of the TSVs connected to the corresponding one of the third conductive components, exclusive of an interposer layer comprising conductive traces.

* * * * *